US011591228B2

(12) United States Patent
Pan et al.

(10) Patent No.: US 11,591,228 B2
(45) Date of Patent: Feb. 28, 2023

(54) COMPOUND STRONTIUM FLUOROBORATE AND STRONTIUM FLUOROBORATE NONLINEAR OPTICAL CRYSTAL, AND PREPARATION METHODS AND USES THEREOF

(71) Applicant: XINJIANG TECHNICAL INSTITUTE OF PHYSICS & CHEMISTRY, CHINESE ACADEMY OF SCIENCES, Xinjiang (CN)

(72) Inventors: Shilie Pan, Urumqi (CN); Miriding Mutailipu, Urumqi (CN); Min Zhang, Urumqi (CN)

(73) Assignee: XINJIANG TECHNICAL INSTITUTE OF PHYSICS & CHEMISTRY, CHINESE ACADEMY OF SCIENCES, Urumqi (CN)

( * ) Notice: Subject to any disclaimer, the term of this patent is extended or adjusted under 35 U.S.C. 154(b) by 417 days.

(21) Appl. No.: 16/759,547

(22) PCT Filed: Feb. 11, 2018

(86) PCT No.: PCT/CN2018/076210
§ 371 (c)(1),
(2) Date: Apr. 27, 2020

(87) PCT Pub. No.: WO2019/095573
PCT Pub. Date: May 23, 2019

(65) Prior Publication Data
US 2020/0283302 A1 Sep. 10, 2020

(30) Foreign Application Priority Data
Nov. 17, 2017 (CN) .......................... 2017111425136

(51) Int. Cl.
*C01B 35/12* (2006.01)
*C30B 1/10* (2006.01)
(Continued)

(52) U.S. Cl.
CPC .............. *C01B 35/127* (2013.01); *C30B 1/10* (2013.01); *C30B 11/002* (2013.01);
(Continued)

(58) Field of Classification Search
CPC ....... C01B 35/127; C30B 1/10; C30B 11/002; C30B 11/003; C30B 11/06; C30B 11/08; C30B 29/12; C30B 9/12; G02F 1/3551
See application file for complete search history.

(56) References Cited

U.S. PATENT DOCUMENTS 3,657,141 A * 4/1972 Chenot .............. C09K 11/7797
252/301.4 R
2015/0314613 A1* 11/2015 Murphy ................. C12M 33/12
435/283.1
2017/0199507 A1* 7/2017 Murphy ................ B29C 64/182

FOREIGN PATENT DOCUMENTS

| CN | 101717642 A | 6/2010 |
| CN | 101962540 A | 2/2011 |
| CN | 103590106 A | 2/2014 |

OTHER PUBLICATIONS

Jul. 26, 2018 International Search Report issued in International Patent Application No. PCT/CN2018/076210.

* cited by examiner

*Primary Examiner* — Matthew J Song
(74) *Attorney, Agent, or Firm* — Oliff PLC

(57) ABSTRACT

A compound strontium fluoroborate, nonlinear optical crystal of strontium fluoroborate, preparation method thereof; the chemical formula of the compound is $SrB_5O_7F_3$, its molecular weight is 310.67, and it is prepared by solid-state (Continued)

reaction; the chemical formula of the crystal is SrB5O7F3, its molecular weight is 310.67, the crystal is of the orthorhombic series, the space group is Ccm21, and the crystal cell parameters are=10.016(6) Å, b=8.654(6)(4) Å, c=8.103 (5) Å, Z=4, and V=702.4(8) Å3. A SrB5O7F3 nonlinear optical crystal has uses in the preparation of a harmonic light output when doubling, tripling, quadrupling, quintupling, or sextupling the frequency of a 1064-nm fundamental-frequency light outputted by a Nd:YAG laser, or the generation of a deep-ultraviolet frequency doubling light output lower than 200 nm, or in the preparation of a frequency multiplier, upper or lower frequency converter, or an optical parametric oscillator.

8 Claims, 1 Drawing Sheet

(51) Int. Cl.
*C30B 11/00* (2006.01)
*C30B 11/08* (2006.01)
*G02F 1/355* (2006.01)

(52) U.S. Cl.
CPC ............ *C30B 11/003* (2013.01); *C30B 11/08* (2013.01); *G02F 1/3551* (2013.01)

COMPOUND STRONTIUM FLUOROBORATE AND STRONTIUM FLUOROBORATE NONLINEAR OPTICAL CRYSTAL, AND PREPARATION METHODS AND USES THEREOF

CROSS-REFERENCE TO RELATED APPLICATION

The present application claims the priority of the Chinese Patent Application No. 201711142513.6 filed on Nov. 17, 2017, entitled "Compound Strontium Fluoroborate and Strontium Fluoroborate Nonlinear Optical Crystal, and Preparation Methods and Uses Thereof", which is herein incorporated by reference.

FIELD OF INVENTION

The present invention relates to a compound strontium fluoroborate and a strontium fluoroborate nonlinear optical crystal, and preparation methods and uses thereof.

BACKGROUND

With a strong requirement of 193 nm lithography technology, micro-nano fine laser processing, and ultra-high energy resolution photoelectron spectroscopy and photoelectron emission microscopes and other modem instruments on deep UV laser light source (typically, with a wavelength below 200 nm), it has become a research hotspot recently to develop an all-solid-state deep UV laser light source in the international laser science community. To develop an all-solid-state deep UV laser light source, the deep UV nonlinear optical crystal is a very important element.

UV and deep UV nonlinear optical crystals currently used in industry mainly include $LiB_3O_5$ (LBO), $CsB_3O_5$ (CBO), $CsLiB_6O_{10}$ (CLBO), $BaB_2O_4$ (BBO) and $KBe_2BO_3F_2$ (KBBF) crystals. LBO crystals have a wide range of light transmission, a high optical uniformity, as well as a large effective multiplication factor (3KDP) and a high damage threshold (18.9 GW/cm$^2$). However, due to a relatively low birefringence ($\Delta n$=0.04-0.05), phase matching cannot be realized in the deep UV region, and the minimum harmonic wavelength is 276 nm. Similar to LBO crystals, the application of CBO and CLBO crystals in a deep UV region is also restricted due to a relatively low birefringence of CBO and CLBO crystals. Although BBO crystals have a larger nonlinear optical crystal coefficient and birefringence, but their application in the deep UV region is also restricted, since the shortest harmonic wavelength of BBO is only 204.8 nm due to a relatively high UV absorption cut-off edge (189 nm). KBBF crystal can achieves a direct sixth generation output of 1064 nm fundamental frequency light. However, KBBF crystals have a strong layered growth habit, and are very difficult to grow large-sized crystals, thereby limiting the application to an extent. Therefore, the development of a novel deep UV nonlinear optical crystal with an excellent comprehensive performance is in urgent need.

SUMMARY OF THE INVENTION

An object of the present invention is to provide a compound strontium fluoroborate having a chemical formula of $SrB_5O_7F_3$ with a molecular weight of 310.67. The compound is prepared via a solid-phase reaction method.

Another object of the present invention is to provide a strontium fluoroborate $SrB_5O_7F_3$ nonlinear optical crystal having a chemical formula of $SrB_5O_7F_3$ with a molecular weight of 310.67. The crystal belongs to the orthorhombic crystal system with the space group of $Cmc2_1$, and has cell parameters as follows: a=10.016(6) Å, b=8.654(6)(4) Å, c=8.103(5) Å, Z=4, V=702.4(8) Å$^3$.

Still another object of the present invention is to provide methods for preparing the strontium fluoroborate nonlinear optical crystal, wherein crystals are grown by means of a flux method, A Bridgman-Stockbarger method, a room-temperature solution method and a solvothermal method.

Yet another object of the present invention is to provide uses of a strontium fluoroborate $SrB_5O_7F_3$ nonlinear optical crystal.

The compound strontium fluoroborate described in the present invention has a chemical formula of $SrB_5O_7F_3$ with a molecular weight of 310.67, and is prepared by a solid-phase reaction method.

The method for preparing the compound strontium fluoroborate is performed in the following steps:
homogeneously mixing an Sr-containing compound which is $Sr(BF_4)_2$, B-containing compounds which are $H_3BO_3$ and $B_2O_3$, an F-containing compound which is $Sr(BF_4)_2$ at a molar ratio of Sr:B:F=0.5-2:5-7:2-4, adding the mixture into a hydrothermal reactor or a quartz tube for sealing, placing the hydrothermal reactor or the quartz tube into a resistance furnace, heating at a rate of 10-30° C./h to 180-620° C. for 10-48 h, then cooling at a rate of 1-10° C./h to 25° C., and opening the hydrothermal reactor or the quartz tube to give the compound $SrB_5O_7F_3$.

A strontium fluoroborate nonlinear optical crystal has a chemical formula of $SrB_5O_7F_3$ with a molecular weight of 310.67. The crystal belongs to the orthorhombic crystal system with the space group of $Cmc2_1$, and has cell parameters as follows: a=10.016(6) Å, b=8.654(6)(4) Å, c=8.103(5) Å, Z=4, V=702.4(8) Å$^3$.

In the methods for preparing the strontium fluoroborate nonlinear optical crystal, crystals are grown by means of a flux method, a Bridgman-Stockbarger method, a room-temperature solution method or a solvothermal method.

The flux method for growing the strontium fluoroborate nonlinear optical crystal is particularly carried out in the following steps:

a, homogeneously mixing an Sr-containing compound which is $Sr(BF_4)_2$, B-containing compounds which are $H_3BO_3$ and $B_2O_3$, an F-containing compound which is $Sr(BF_4)_2$ at a molar ratio of Sr:B:F=0.5-2:5-7:2-4, adding the mixture into a hydrothermal reactor or a quartz tube for sealing, placing the hydrothermal reactor or the quartz tube into a resistance furnace, heating at a rate of 10-30° C./h to 180-620° C. for 10-48 h, then cooling at a rate of 1-10° C./h to 25° C., and opening the hydrothermal reactor or the quartz tube to give the compound $SrB_5O_7F_3$;

b, adding the resultant compound $SrB_5O_7F_3$ into a quartz tube of Φ10 mm, vacuumizing the quartz tube to a vacuum degree of 1×10$^{-3}$ Pa, and performing vacuum packaging with a flamer, placing the quartz tube into a muffle furnace, heating at a rate of 10-30° C./h to 200-650° C. for 12-60 h, then cooling at a rate of 1-5° C./h to 25° C., and opening the quartz tube to give a seed crystal of $SrB_5O_7F_3$ crystal;

c, placing the seed crystal of $SrB_5O_7F_3$ crystal obtained in step b on the bottom of a container which is a quartz tube, then mixing the compound $SrB_5O_7F_3$ obtained in step a with a flux which is NaF, NaBF$_4$, NaF—$H_3BO_3$, NaF—$B_2O_3$, $H_3BO_3$ or $B_2O_3$ at a molar ratio of 1:1-5, placing the mixture into the quartz tube, vacuumizing the quartz tube to a vacuum degree of $1\times10^{-3}$ Pa, and performing vacuum packaging with a flamer; and d, sealing the container in step c or adding 10-100 mL of solvent which is deionized water, anhydrous ethanol, or hydrofluoric acid for re-sealing, placing the hydrothermal reactor or the quartz tube into a resistance furnace, heating at a rate of 20-40° C./h to 150-650° C. for 12-60 h, cooling at a rate of 1-3° C./day to 50° C., then cooling at a rate of 1-10° C./h to 25° C., and opening the container to give an $SrB_5O_7F_3$ crystal with a dimension of 1-20 mm.

The Bridgman-Stockbarger method for growing the strontium fluoroborate nonlinear optical crystal is particularly carried out in the following steps:

a, homogeneously mixing an Sr-containing compound which is $Sr(BF_4)_2$, B-containing compounds which are $H_3BO_3$ and $B_2O_3$, an F-containing compound which is $Sr(BF_4)_2$ at a molar ratio of Sr:B:F=0.5-2:5-7:2-4, adding the mixture into a hydrothermal reactor or a quartz tube for sealing, placing the hydrothermal reactor or the quartz tube into a resistance furnace, heating at a rate of 10-30° C./h to 180-620° C. for 10-48 h, then cooling at a rate of 1-10° C./h to 25° C., and opening the hydrothermal reactor or the quartz tube to give the compound $SrB_5O_7F_3$;

b, adding the resultant compound $SrB_5O_7F_3$ into the hydrothermal reactor for sealing, placing the hydrothermal reactor into a drying oven, heating at a rate of 20° C./h to 200° C. for 10 h, then cooling at a rate of 1° C./h to 25° C., and opening the hydrothermal reactor to give a seed crystal of $SrB_5O_7F_3$ crystal;

c, placing the resultant seed crystal on the bottom of an iridium crucible, then adding the resultant compound $SrB_5O_7F_3$ into the iridium crucible; and d, sealing the container in step c and placing it into a crucible descending furnace, heating to 300-600° C., keeping the temperature for 10-20 h, adjusting the position of the container to allow the temperature of spontaneous nucleation or seeding to be 350-600° C., and slowly descending the container at a rate of 0.05-2 mm/h while keeping the growth temperature constant or slowly cooling at a rate of 0-3° C./h, after the completion of growth, cooling the growth furnace to 25° C., and removing the container to give an $SrB_5O_7F_3$ crystal with a dimension of 1-20 mm.

The room-temperature solution method for growing the strontium fluoroborate nonlinear optical crystal is particularly carried out in the following steps:

a, homogeneously mixing an Sr-containing compound which is $Sr(BF_4)_2$, B-containing compounds which are $H_3BO_3$ and $B_2O_3$, an F-containing compound which is $Sr(BF_4)_2$ at a molar ratio of Sr:B:F=0.5-2:5-7:2-4, adding the mixture into a hydrothermal reactor or a quartz tube for sealing, placing the hydrothermal reactor or the quartz tube into a resistance furnace, heating at a rate of 10-30° C./h to 180-620° C. for 10-48 h, then cooling at a rate of 1-10° C./h to 25° C., and opening the hydrothermal reactor or the quartz tube to give the compound $SrB_5O_7F_3$;

b, adding the compound $SrB_5O_7F_3$ obtained in step a into the hydrothermal reactor for sealing, placing the hydrothermal reactor into a drying oven, heating at a rate of 10-30° C./h to 200-600° C. for 10-48 h, then cooling at a rate of 1-5° C./h to 25° C., and opening the hydrothermal reactor or the quartz tube to give a seed crystal of $SrB_5O_7F_3$ crystal;

c, placing the seed crystal obtained in step b on the bottom of a cleaned container, then adding the resultant compound $SrB_5O_7F_3$ into the container; and d, adding into the container in step c 10-100 mL of solvent which is deionized water, anhydrous ethanol or hydrofluoric acid, which is then subjected to an ultrasonic treatment for sufficient mixing and dissolution, adjusting the pH of the solution to 1-11, filtering the mixture with a qualitative filter paper, encapsulating the container with a PVC film, placing the container in a static environment without shaking, contamination, or air convection, piercing and forming several holes in the seal to adjust the evaporation rate of the solvent in the solution, standing at room temperature, and after the completion of growth, giving with an $SrB_5O_7F_3$ crystal with a dimension of 1-20 mm.

The solvothermal method for growing the strontium fluoroborate nonlinear optical crystal is particularly carried out in the following steps:

a, homogeneously mixing an Sr-containing compound which is $Sr(BF_4)_2$, B-containing compounds which are $H_3BO_3$ and $B_2O_3$, an F-containing compound which is $Sr(BF_4)_2$ at a molar ratio of Sr:B:F=0.5-2:5-7:2-4, adding the mixture into a hydrothermal reactor or a quartz tube for sealing, placing the hydrothermal reactor or the quartz tube into a resistance furnace, heating at a rate of 10-30° C./h to 180-620° C. for 10-48 h, then cooling at a rate of 1-10° C./h to 25° C., and opening the hydrothermal reactor or the quartz tube to give the compound $SrB_5O_7F_3$;

b, adding the compound $SrB_5O_7F_3$ obtained in step a into the hydrothermal reactor for sealing, placing the hydrothermal reactor into a drying oven, heating at a rate of 10-30° C./h to 200-600° C. for 10-48 h, then cooling at a rate of 1-5° C./h to 25° C., and opening the hydrothermal reactor or the quartz tube to give a seed crystal of $SrB_5O_7F_3$ crystal;

c, placing the seed crystal obtained in step b on the bottom of the PTFE lining of a clean and non-contaminated hydrothermal reactor with a volume of 23 mL, then adding the resultant compound $SrB_5O_7F_3$ into the PTFE lining; and d, adding into the PTFE lining a solvent which is deionized water, and tightly sealing the hydrothermal reactor; placing the hydrothermal reactor into a drying oven, heating at a rate of 20° C./h to 150° C. for 24 h, cooling at a rate of 2° C./day to 130° C. and then cooling at a rate of 2° C./h to 25° C., and opening the hydrothermal reactor to give the $SrB_5O_7F_3$ crystal.

In the flux system of $NaF—H_3BO_3$ in step c, the molar ratio of NaF to $H_3BO_3$ is 1-3:1-5; and in the $NaF—B_2O_3$ system, the molar ratio of NaF to $B_2O_3$ is 1-2:1-4.

The present invention describes use of the nonlinear optical crystal of strontium fluoroborate for preparing an Nd:YAG laser which produces 2nd, or 3rd, or 4th, or 5th, or 6th harmonic light output based on a fundamental frequency light output of 1064 nm.

The present invention describes use of the strontium fluoroborate nonlinear optical crystal for producing deep UV harmonic light output below 200 nm.

The present invention describes use of the strontium fluoroborate nonlinear optical crystal for preparing a harmonic generator, an up-and-down frequency converter, or an optical parametric-oscillator.

In the compound strontium fluoroborate and the strontium fluoroborate nonlinear optical crystal, as well as the preparation method and use described in the present invention, the container used in the method is a platinum crucible, an iridium crucible, a ceramic crucible, a quartz tube, a conical flask, a beaker, a hydrothermal reactor lined with a PTFE lining or a hydrothermal reactor equipped with a platinum sleeving and lined with stainless steel lining. When the container is a quartz tube, the quartz tube should be vacuumized before sealing, to avoid breakage of the quartz tube due to gas release during reaction. When the container is a conical flask or a beaker, the container needs to be washed with an acid, rinsed with deionized water, and dried.

The used resistance furnace is muffle furnace or a drying oven.

Through the method for preparing the strontium fluoroborate nonlinear optical crystal of the present invention, an $SrB_5O_7F_3$ nonlinear optical crystal with a centimeter-scale dimension is obtained, and the $SrB_5O_7F_3$ nonlinear optical crystal has no distinct layered growth habit. By using large-dimension crucible or container and extending the growth period of the crystal, the corresponding large-sized nonlinear optical crystal $SrB_5O_7F_3$ can be obtained. During the growth of the $SrB_5O_7F_3$ nonlinear optical crystal, the crystal is easy to grow, transparent and free of inclusion, and has advantages including rapid growth, low cost, ease obtaining of large-sized crystals.

Through the method for preparing the strontium fluoroborate nonlinear optical crystal of the present invention, large-sized $SrB_5O_7F_3$ nonlinear optical crystals are obtained. According to the crystallographic data of the crystal, the crystal blank is oriented. The crystal is cut according to the required angle, thickness and cross-sectional size. A clear surface of the crystal is polished, and then the crystal can be uses as a nonlinear optical device. The $SrB_5O_7F_3$ nonlinear optical crystal has a wide light transmission band, stable physical and chemical properties, and high mechanical hardness, and is difficult to crack and deliquesce, and easy to cut, polish and store.

DETAILED DESCRIPTION OF THE EMBODIMENTS

Example 1

Figure 1:
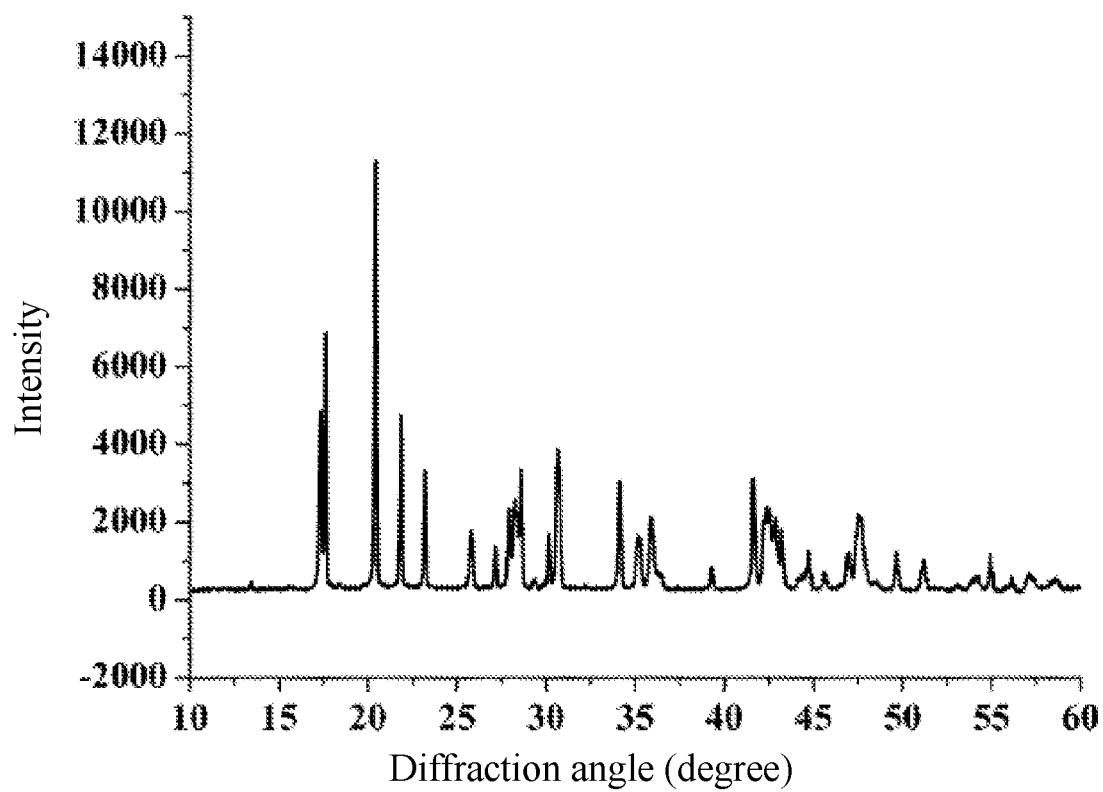
FIG. 1 is a powder XRD spectrum of the compound $SrB_5O_7F_3$ of the present invention. The spectrum is consistent with the theoretical XRD spectrum, indicating the existence of the compound $SrB_5O_7F_3$.

Preparation of the Compound:

The compound $SrB_5O_7F_3$ was synthesized by a solid-phase reaction method according to the equation of $3Sr(BF_4)_2+7B_2O_3 \rightarrow 3SrB_5O_7F_3+5BF_3\uparrow$.

$Sr(BF_4)_2$ and $B_2O_3$ were homogeneously mixed at a molar ratio of 3:7. The mixture was added into a quartz tube of Φ10 mm. The quartz tube was vacuumized to a vacuum degree of $1\times10^{-3}$ Pa, and subjected to vacuum packaging with a flamer. The quartz tube was placed into a muffle furnace, and heated at a rate of 30° C./h to 600° C. for 12 h. Then, the quartz tube was cooled at a rate of 6° C./h to 25° C., and opened to give the compound $SrB_5O_7F_3$.

Example 2

Preparation of the Compound:

The compound $SrB_5O_7F_3$ was synthesized by a solid-phase reaction method according to the equation of $3Sr(BF_4)_2+14H_3BO_3 \rightarrow 3SrB_5O_7F_3+5BF_3\uparrow+21H_2O\uparrow$:

$Sr(BF_4)_2$ and $H_3BO_3$ were homogeneously mixed at a molar ratio of 3:14, and added into the PTFE lining of a clean and non-contaminated hydrothermal reactor with a volume of 23 mL. The hydrothermal reactor was tightly sealed, placed in a drying oven, heated at a rate of 35° C./h to 200° C. for 60 h, then cooled at a rate of 6° C./h to 25° C., and opened to give the compound $SrB_5O_7F_3$.

Example 3

Synthesis of the $SrB_5O_7F_3$ nonlinear optical crystal by a room-temperature solution method:

The $SrB_5O_7F_3$ compound was synthesized according to the equation of $3Sr(BF_4)_2+7B_2O_3 \rightarrow 3SrB_5O_7F_3+5BF_3\uparrow$. The particular operation steps are similar to those in EXAMPLE 1.

The resultant compound $SrB_5O_7F_3$ was added into a hydrothermal reactor for sealing. The hydrothermal reactor was placed into a drying oven, heated at a rate of 20° C./h to 200° C. for 10 h, then cooled at a rate of 1° C./h to 25° C., and opened to give a seed crystal of $SrB_5O_7F_3$ crystal.

The resultant seed crystal was placed on the bottom of a cleaned beaker, and then the resultant compound $SrB_5O_7F_3$ was added into the beaker. To the beaker was added 5 mL of solvent hydrofluoric acid. Then, the mixture was subjected to an ultrasonic treatment for sufficient mixing and dissolution. The pH of the solution was adjusted to 4-6, and the solution was filtered with a qualitative filter paper. The container was encapsulated with a PVC film, and placed in a static environment without shaking, contamination, or air convection. The sealing film was pierced with several holes to adjust the evaporation rate of the solvent in the solution, and then the solution stood at room temperature, after the completion of growth, an $SrB_5O_7F_3$ crystal with a dimension of Φ3 mm×4 mm×5 mm was obtained.

Example 4

Synthesis of the $SrB_5O_7F_3$ nonlinear optical crystal by a room-temperature solution method:

The $SrB_5O_7F_3$ compound was synthesized according to the equation of $3Sr(BF_4)_2+14H_3BO_3 \rightarrow 3SrB_5O_7F_3+5BF_3\uparrow+21H_2O\uparrow$. The particular operation steps are similar to those in EXAMPLE 1.

The resultant compound $SrB_5O_7F_3$ was added into a quartz tube of Φ10 mm which was vacuumized to a vacuum degree of $1\times10^{-3}$ Pa, and vacuum packaging was performed with a flamer. The quartz tube was placed into a muffle furnace, heated at a rate of 40° C./h to 600° C. for 48 h, then cooled at a rate of 5° C./h to 25° C., and opened to give a seed crystal of $SrB_5O_7F_3$ crystal.

The resultant seed crystal was placed on the bottom of the container, and then the resultant compound $SrB_5O_7F_3$ was placed into the conical flask.

To the conical flask was added 100 mL of anhydrous ethanol. Then, the mixture was subjected to an ultrasonic treatment for sufficient mixing and dissolution, and filtered with a qualitative filter paper. The container was encapsulated with a PVC film, and placed in a static environment without shaking, contamination, or air convection. The sealing film was pierced with several holes to adjust the evaporation rate of the solvent in the solution, and the solution stood at room temperature. After the completion of growth, an $SrB_5O_7F_3$ crystal with a dimension of Φ5 mm×2 mm×3 mm was obtained.

Example 5

Growth of $SrB_5O_7F_3$ crystal by a room-temperature solution method:

The $SrB_5O_7F_3$ compound was synthesized according to the equation of $3Sr(BF_4)_2+14H_3BO_3 \rightarrow 3SrB_5O_7F_3+5BF_3\uparrow+21H_2O\uparrow$. The particular operation steps are similar to those in EXAMPLE 2.

The resultant compound $SrB_5O_7F_3$ was added into the hydrothermal reactor for sealing. The hydrothermal reactor was placed into a drying oven, heated at a rate of 30° C./h to 280° C. for 20 h, then cooled at a rate of 2° C./h to 25° C., and the hydrothermal reactor was opened to give a seed crystal of $SrB_5O_7F_3$ crystal.

The resultant seed crystal was placed on the bottom of the beaker, and then the compound $SrB_5O_7F_3$ obtained in step a was added into the beaker.

To the beaker was added deionized water. The mixture was then subjected to an ultrasonic treatment for sufficient mixing and dissolution, and filtered with a qualitative filter paper. The container was encapsulated with a PVC film, and placed in a static environment without shaking, contamination, or air convection. The sealing film was pierced with several holes to adjust the evaporation rate of the solvent in the solution. The solution stood at room temperature. After the completion of growth, an $SrB_5O_7F_3$ crystal with a dimension of $\Phi 6$ mm×6 mm×5 mm was obtained.

Example 6

Growth of $SrB_5O_7F_3$ crystal by a flux method:

The $SrB_5O_7F_3$ compound was synthesized according to the equation of $3Sr(BF_4)_2+7B_2O_3 \rightarrow 3SrB_5O_7F_3+5BF_3\uparrow$. The particular operation steps are similar to those in EXAMPLE 2.

The resultant compound $SrB_5O_7F_3$ was added into a quartz tube of $\Phi 10$ mm which was vacuumized to a vacuum degree of $1\times 10^{-3}$ Pa, and the quartz tube was subjected to vacuum packaging with a flamer. The quartz tube was placed into a muffle furnace, heated at a rate of 30° C./h to 400° C. for 30 h, then cooled at a rate of 2° C./h to 25° C., and the quartz tube was opened to give a seed crystal of $SrB_5O_7F_3$ crystal.

The resultant $SrB_5O_7F_3$ seed crystal was placed on the bottom of the container, and then the resultant compound $SrB_5O_7F_3$ was mixed with a flux which was NaF at a molar ratio of 1:5. The mixture was placed into the quartz tube, the quartz tube was vacuumized to a vacuum degree of $1\times 10^{-3}$ Pa, and subjected to vacuum packaging with a flamer.

Then, the quartz tube was placed into a muffle furnace, heated at a rate of 30° C./h to 500° C. for 36 h, then cooled at a rate of 1.5° C./day to 450° C. and then cooled at a rate of 2° C./h to 25° C. The quartz tube was cut to give an $SrB_5O_7F_3$ crystal with a dimension of $\Phi 5$ mm×5 mm×5 mm.

Example 7

Growth of $SrB_5O_7F_3$ crystal by a flux method:

The $SrB_5O_7F_3$ compound was synthesized according to the equation of $3Sr(BF_4)_2+7B_2O_3 \rightarrow 3SrB_5O_7F_3+5BF_3\uparrow$. The particular operation steps are similar to those in EXAMPLE 1.

The resultant compound $SrB_5O_7F_3$ was added into a quartz tube of $\Phi 10$ mm. The quartz tube was vacuumized to a vacuum degree of $1\times 10^{-3}$ Pa, and subjected to vacuum packaging with a flamer. The quartz tube was placed into a muffle furnace, heated at a rate of 20° C./h to 300° C. for 10 h, then cooled at a rate of 1° C./h to 25° C., and the quartz tube was opened to give a seed crystal of $SrB_5O_7F_3$ crystal.

First, a seed crystal of $SrB_5O_7F_3$ crystal was placed on the bottom of a quartz tube of $\Phi 10$ mm. Then the compound $SrB_5O_7F_3$ was mixed with a flux $NaF:H_3BO_3$ at a molar ratio of 1:1, wherein the flux $NaF:H_3BO_3$ included NaF and $H_3BO_3$ at a molar ratio of 1:1. The mixture was placed into the quartz tube, which was vacuumized to a vacuum degree of $1\times 10^{-3}$ Pa, and subjected to vacuum packaging with a flamer.

Then, the quartz tube was placed into a muffle furnace, heated at a rate of 30° C./h to 450° C. for 24 h, then cooled at a rate of 1.5° C./day to 400° C., and then cooled at a rate of 2° C./h to 25° C. The quartz tube was cut to give an $SrB_5O_7F_3$ crystal with a dimension of $\Phi 10$ mm×7 mm×6 mm.

Example 8

Growth of $SrB_5O_7F_3$ crystal by a flux method:

The $SrB_5O_7F_3$ compound was synthesized according to the equation of $3Sr(BF_4)_2+14H_3BO_3 \rightarrow 3SrB_5O_7F_3+5BF_3\uparrow+21H_2O\uparrow$. The particular operation steps are similar to those in EXAMPLE 2.

The resultant compound $SrB_5O_7F_3$ was added into a quartz tube of $\Phi 10$ mm. The quartz tube was vacuumized to a vacuum degree of $1\times 10^{-3}$ Pa, and subjected to vacuum packaging with a flamer. The quartz tube was placed in to a muffle furnace, heated at a rate of 40° C./h to 500° C. for 40 h, then cooled at a rate of 4° C./h to 25° C., and the quartz tube was opened to give a seed crystal of $SrB_5O_7F_3$ crystal.

The resultant $SrB_5O_7F_3$ seed crystal was placed on the bottom of the container, then the resultant compound $SrB_5O_7F_3$ was mixed with a flux which is $NaF:B_2O_3$ at a molar ratio of 1:3, wherein the $NaF-B_2O_3$ system included NaF and $B_2O_3$ at a molar ratio of 1:2. The mixture was placed into the quartz tube, the quartz tube was vacuumized to a vacuum degree of $1\times 10^{-3}$ Pa, and was subjected to vacuum packaging with a flamer.

Then, the quartz tube was placed into a muffle furnace, heated at a rate of 40° C./h to 450° C. for 20 h, then cooled at a rate of 2° C./day to 400° C. and then cooled at a rate of 3° C./h to 25° C. The quartz tube was cut to give an $SrB_5O_7F_3$ crystal with a dimension of $\Phi 5$ mm×6 mm×8 mm.

Example 9

Growth of $SrB_5O_7F_3$ crystal by a flux method:

The $SrB_5O_7F_3$ compound was synthesized according to the equation of $3Sr(BF_4)_2+14H_3BO_3 \rightarrow 3SrB_5O_7F_3+5BF_3\uparrow+21H_2O\uparrow$. The particular operation steps are similar to those in EXAMPLE 1.

The resultant compound $SrB_5O_7F_3$ was added into a quartz tube of $\Phi 10$ mm, the quartz tube was vacuumized to a vacuum degree of $1\times^{-3}$ Pa, and was subjected to vacuum packaging with a flamer. The quartz tube was placed into a muffle furnace, heated at a rate of 25° C./h to 300° C. for 30 h, then cooled at a rate of 3° C./h to 25° C., and the quartz tube was opened to give a seed crystal of $SrB_5O_7F_3$ crystal.

First, a seed crystal of $SrB_5O_7F_3$ crystal was placed on the bottom of a quartz tube of $\varphi 10$ mm. Then, the $SrB_5O_7F_3$ compound was mixed with a flux $NaBF_4$ at a molar ratio of 1:5. The mixture was placed into the quartz tube, and the quartz tube was vacuumized to a vacuum degree of $1\times 10^{-3}$ Pa, and was subjected to vacuum packaging with a flamer.

Then, the quartz tube was placed into a muffle furnace, heated at a rate of 40° C./h to 600° C. for 48 h, then cooled at a rate of 3° C./day to 550° C., and then cooled at a rate of 10° C./h to 25° C. The quartz tube was cut to give an $SrB_5O_7F_3$ crystal with a dimension of Φ8 mm×7 mm×6 mm.

Example 10

Growth of $SrB_5O_7F_3$ crystal by a flux method:
The $SrB_5O_7F_3$ compound was synthesized according to the equation of $3Sr(BF_4)_2+7B_2O_3 \rightarrow 3SrB_5O_7F_3+5BF_3\uparrow$. The particular operation steps are similar to those in EXAMPLE 1.

The resultant compound $SrB_5O_7F_3$ was added into the hydrothermal reactor for sealing, the hydrothermal reactor was placed into a drying oven, heated at a rate of 25° C./h to 210° C. for 15 h, then cooled at a rate of 3° C./h to 25° C., and the hydrothermal reactor was opened to give a seed crystal of $SrB_5O_7F_3$ crystal.

First, a seed crystal of $SrB_5O_7F_3$ crystal was placed on the bottom of a quartz tube of φ10 mm, then the compound $SrB_5O_7F_3$ was mixed with a flux $NaF:H_3BO_3$ at a molar ratio of 1:5, wherein the flux $NaF:H_3BO_3$ included NaF and $H_3BO_3$ at a molar ratio of 2:3. The mixture was placed into a quartz tube, and the quartz tube was vacuumized to a vacuum degree of $1\times10^{-3}$ Pa, and was subjected to vacuum packaging with a flamer.

Then, the quartz tube was placed into a muffle furnace, heated at a rate of 30° C./h to 450° C. for 24 h, then cooled at a rate of 1.5° C./day to 400° C., and then cooled at a rate of 2° C./h to 25° C. The quartz tube was cut to give an $SrB_5O_7F_3$ crystal with a dimension of Φ5 mm×5 mm×4 mm.

Example 11

Growth of $SrB_5O_7F_3$ crystal by a flux method:
The $SrB_5O_7F_3$ compound was synthesized according to the equation of $3Sr(BF_4)_2+7B_2O_3 \rightarrow 3SrB_5O_7F_3+5BF_3\uparrow$. The particular operation steps are similar to those in EXAMPLE 2.

The resultant compound $SrB_5O_7F_3$ was added into a quartz tube of Φ10 mm, the quartz tube was vacuumized to a vacuum degree of $1\times10^{-3}$ Pa, and was subjected to vacuum packaging with a flamer. The quartz tube was placed into a muffle furnace, heated at a rate of 40° C./h to 500° C. for 46 h, then cooled at a rate of 4° C./h to 25° C., and the quartz tube was opened to give a seed crystal of $SrB_5O_7F_3$ crystal.

The resultant $SrB_5O_7F_3$ seed crystal was placed on the bottom of a quartz tube. Then, the resultant compound $SrB_5O_7F_3$ was mixed with a flux which was $NaF:B_2O_3$ at a molar ratio of 1:5, wherein $NaF-B_2O_3$ system included NaF and $B_2O_3$ at a molar ratio of 1:4. The mixture was placed into the quartz tube, and the quartz tube was vacuumized to a vacuum degree of $1\times10^{-3}$ Pa, and was subjected to vacuum packaging with a flamer.

Then, the quartz tube was placed into a muffle furnace, heated at a rate of 40° C./h to 400° C. for 20 h, then cooled at a rate of 2° C./day to 350° C., and then cooled at a rate of 3° C./h to 25° C. The quartz tube was cut to give an $SrB_5O_7F_3$ crystal with a dimension of Φ5 mm×4 mm×7 mm.

Example 12

Growth of $SrB_5O_7F_3$ crystal by a flux method:
The $SrB_5O_7F_3$ compound was synthesized according to the equation of $3Sr(BF_4)_2+14H_3BO_3 \rightarrow 3SrB_5O_7F_3+5BF_3\uparrow+21H_2O\uparrow$. The particular operation steps are similar to those in EXAMPLE 1.

The resultant compound $SrB_5O_7F_3$ was added into the hydrothermal reactor for sealing, the hydrothermal reactor was placed into a drying oven, heated at a rate of 25° C./h to 220° C. for 30 h, then cooled at a rate of 3° C./h to 25° C., and the hydrothermal reactor was opened to give a seed crystal of $SrB_5O_7F_3$ crystal;

First, a seed crystal of $SrB_5O_7F_3$ crystal was placed on the bottom of a quartz tube of φ10 mm. Then, the $SrB_5O_7F_3$ compound was mixed with a flux $H_3BO_3$ at a molar ratio of 1:5. The mixture was placed into the quartz tube, and the quartz tube was vacuumized to a vacuum degree of $1\times10^{-3}$ Pa, and was subjected to vacuum packaging with a flamer.

Then, the quartz tube was placed into a muffle furnace, heated at a rate of 40° C./h to 600° C. for 48 h, then cooled at a rate of 3° C./day to 550° C. and then cooled at a rate of 10° C./h to 25° C. The quartz tube was cut to give an $SrB_5O_7F_3$ crystal with a dimension of φ5 mm×6 mm×4 mm.

Example 13

Growth of $SrB_5O_7F_3$ crystal by a flux method:
The $SrB_5O_7F_3$ compound was synthesized according to the equation of $3Sr(BF_4)_2+14H_3BO_3 \rightarrow 3SrB_5O_7F_3+5BF_3\uparrow+21H_2O\uparrow$. The particular operation steps are similar to those in EXAMPLE 2.

The resultant compound $SrB_5O_7F_3$ was added into a quartz tube of Φ10 mm, the quartz tube was vacuumized to a vacuum degree of $1\times10^{-3}$ Pa, and was subjected to vacuum packaging with a flamer. The quartz tube was placed into a muffle furnace, heated at a rate of 35° C./h to 550° C. for 40 h, then cooled at a rate of 5° C./h to 25° C., and the quartz tube was opened to give a seed crystal of $SrB_5O_7F_3$ crystal.

The resultant $SrB_5O_7F_3$ seed crystal was placed on the bottom of a quartz tube. Then, the resultant compound $SrB_5O_7F_3$ was mixed with a flux which is $NaF:B_2O_3$ at a molar ratio of 1:5, wherein $NaF-B_2O_3$ system included NaF and $B_2O_3$ at a molar ratio of 2:3. The mixture was placed into the quartz tube, and the quartz tube was vacuumized to a vacuum degree of $1\times10^{-3}$ Pa, and was subjected to vacuum packaging with a flamer.

Then, the quartz tube was placed into a muffle furnace, heated at a rate of 35° C./h to 450° C. for 36 h, then cooled at a rate of 4° C./day to 400° C., and then cooled at a rate of 10° C./h to 30° C. The quartz tube was cut to give an $SrB_5O_7F_3$ crystal with a dimension of Φ6 mm×7 mm×4 mm.

Example 14

Growth of $SrB_5O_7F_3$ crystal by a flux method:
The $SrB_5O_7F_3$ compound was synthesized according to the equation of $3Sr(BF_4)_2+14H_3BO_3 \rightarrow 3SrB_5O_7F_3+5BF_3\uparrow+21H_2O\uparrow$. The particular operation steps are similar to those in EXAMPLE 1.

The resultant compound $SrB_5O_7F_3$ was added into a quartz tube of Φ10 mm, the quartz tube was vacuumized to a vacuum degree of $1\times10^{-3}$ Pa, and was subjected to vacuum packaging with a flamer. The quartz tube was placed into a muffle furnace, heated at a rate of 40° C./h to 550° C. for 25 h, then cooled at a rate of 4° C./h to 25° C. The quartz tube was cut to give a seed crystal of $SrB_5O_7F_3$ crystal.

First, a seed crystal of $SrB_5O_7F_3$ crystal was placed on the bottom of a quartz tube of φ10 mm, then the compound $SrB_5O_7F_3$ was mixed with a flux $NaF:H_3BO_3$ at a molar ratio of 1:10, wherein the flux $NaF:H_3BO_3$ included NaF and $H_3BO_3$ at a molar ratio of 3:5. The mixture was placed into a quartz tube, and the quartz tube was vacuumized to a vacuum degree of 1×10$^{-3}$ Pa, and was subjected to vacuum packaging with a flamer.

Then, the quartz tube was placed into a muffle furnace, heated at a rate of 40° C./h to 550° C. for 40 h, then cooled at a rate of 3° C./day to 500° C., and then cooled at a rate of 8° C./h to 25° C. The quartz tube was cut to give an SrB$_5$O$_7$F$_3$ crystal with a dimension of Φ9 mm×7 mm×6 mm.

Example 15

Growth of SrB$_5$O$_7$F$_3$ crystal by a flux method:

The SrB$_5$O$_7$F$_3$ compound was synthesized according to the equation of 3Sr(BF$_4$)$_2$+14H$_3$BO$_3$→3SrB$_5$O$_7$F$_3$+5BF$_3$↑+ 21H$_2$O↑. The particular operation steps are similar to those in EXAMPLE 1.

The resultant compound SrB$_5$O$_7$F$_3$ was added into a quartz tube of Φ10 mm, the quartz tube was vacuumized to a vacuum degree of 1×10$^{-3}$ Pa, and was subjected to vacuum packaging with a flamer. The quartz tube was placed into a muffle furnace, heated at a rate of 30° C./h to 500° C. for 15 h, then cooled at a rate of 5° C./h to 25° C., and the hydrothermal reactor or the quartz tube was opened to give a seed crystal of SrB$_5$O$_7$F$_3$ crystal.

First, a seed crystal of SrB$_5$O$_7$F$_3$ crystal was placed on the bottom of a quartz tube of φ10 mm. Then, the SrB$_5$O$_7$F$_3$ compound was mixed with a flux B$_2$O$_3$ at a molar ratio of 1:10. The mixture was placed into the quartz tube, and the quartz tube was vacuumized to a vacuum degree of 1×10$^{-3}$ Pa, and was subjected to vacuum packaging with a flamer.

Then, the quartz tube was placed into a muffle furnace, heated at a rate of 40° C./h to 500° C. for 45 h, then cooled at a rate of 3° C. /day to 450° C., and then cooled at a rate of 6° C./h to 25° C. The quartz tube was cut to give an SrB$_5$O$_7$F$_3$ crystal with a dimension of Φ7 mm×6 mm×4 mm.

Example 16

Growth of SrB$_5$O$_7$F$_3$ crystal by a Bridgman-Stockbarger method:

The SrB$_5$O$_7$F$_3$ compound was synthesized according to the equation of 3Sr(BF$_4$)$_2$+7B$_2$O$_3$→3SrB$_5$O$_7$F$_3$+5BF$_3$↑. The particular operation steps are similar to those in EXAMPLE 1.

The resultant compound SrB$_5$O$_7$F$_3$ was added into a quartz tube of Φ10 mm, the quartz tube was vacuumized to a vacuum degree of 1×10$^{-3}$ Pa, and was subjected to vacuum packaging with a flamer. The quartz tube was placed in to a muffle furnace, heated at a rate of 40° C./h to 600° C. for 60 h, then cooled at a rate of 5° C./h to 25° C., and the hydrothermal reactor or the quartz tube was opened to give a seed crystal of SrB$_5$O$_7$F$_3$ crystal.

The resultant seed crystal was placed on the bottom of a platinum crucible, and then the resultant compound SrB$_5$O$_7$F$_3$ was added into the platinum crucible. The platinum crucible was sealed and placed in a crucible descending furnace, heated to 300° C. for 10 h. The position of the container was adjusted to achieve the spontaneous nucleation temperature, and the container was slowly descended at a rate of 0.05 mm/h while the growing temperature was kept constant. After the completion of growth, the growth furnace was cooled to 25° C., and removed to give a crystal with a dimension of Φ6 mm×5 mm×4 mm.

Example 17

Growth of SrB$_5$O$_7$F$_3$ crystal by a Bridgman-Stockbarger method:

The SrB$_5$O$_7$F$_3$ compound was synthesized according to the equation of 3Sr(BF$_4$)$_2$+7B$_2$O$_3$→3SrB$_5$O$_7$F$_3$+5BF$_3$↑. The particular operation steps are similar to those in EXAMPLE 1.

The resultant compound SrB$_5$O$_7$F$_3$ was added into the hydrothermal reactor for sealing, the hydrothermal reactor was placed into a drying oven, heated at a rate of 20° C./h to 200° C. for 10 h, then cooled at a rate of 1° C./h to 25° C., and the hydrothermal reactor was opened to give a seed crystal of SrB$_5$O$_7$F$_3$ crystal.

The resultant seed crystal was placed on the bottom of an iridium crucible, and then the resultant compound SrB$_5$O$_7$F$_3$ was added into the iridium crucible.

The iridium crucible was sealed and placed into a crucible descending furnace, and heated to 650° C. for 20 h. The position of the iridium crucible was adjusted, so that the seeding temperature was 350° C., and then the container was slowly descended at a rate of 2 mm/h and was cooled slowly at a rate of 3° C./h. After the completion of growth, the growth furnace was cooled to 25° C. The iridium crucible was removed to give an SrB5O$_7$F$_3$ crystal with a dimension of Φ7 mm×6 mm×5 mm.

Example 18

Growth of SrB$_5$O$_7$F$_3$ crystal by a Bridgman-Stockbarger method:

The SrB$_5$O$_7$F$_3$ compound was synthesized according to the equation of 3Sr(BF$_4$)$_2$+7B$_2$O$_3$→3SrB$_5$O$_7$F$_3$+5BF$_3$↑. The particular operation steps are similar to those in EXAMPLE 1.

The resultant compound SrB$_5$O$_7$F$_3$ was added into a quartz tube of Φ10 mm, the quartz tube was vacuumized to a vacuum degree of 1×10$^{-3}$ Pa, and was subjected to vacuum packaging with a flamer. The quartz tube was placed into a muffle furnace, heated at a rate of 30° C./h to 400° C. for 36 h, then cooled at a rate of 3° C./h to 25° C. The quartz tube was cut to give a seed crystal of SrB$_5$O$_7$F$_3$ crystal.

The resultant seed crystal was placed on the bottom of a ceramic crucible, and then the resultant compound SrB$_5$O$_7$F$_3$ was added into the ceramic crucible. The ceramic crucible was sealed and placed in a crucible descending furnace, and heated to 450° C. for 15 h. The position of the ceramic crucible was adjusted, so that the seeding temperature was 400° C., and then the ceramic crucible was slowly descended at a rate of 0.5 mm/h while the growing temperature was kept constant. After the completion of growth, the growth furnace was cooed to 25° C. The ceramic crucible was removed to give a crystal with a dimension of Φ6 mm×8 mm×12mm.

Example 19

Growth of SrB$_5$O$_7$F$_3$ crystal by a Bridgman-Stockbarger method:

The SrB$_5$O$_7$F$_3$ compound was synthesized according to the equation of 3Sr(BF$_4$)$_2$+7B$_2$O$_3$→3SrB$_5$O$_7$F$_3$+5BF$_3$↑. The particular operation steps are similar to those in EXAMPLE 1.

The resultant compound SrB$_5$O$_7$F$_3$ was added into a hydrothermal reactor for sealing, the hydrothermal reactor was placed into a drying oven, heated at a rate of 20° C./h to 200° C. for 10 h, then cooled at a rate of 1° C./h to 25° C., and the hydrothermal reactor was opened to give a seed crystal of SrB$_5$O$_7$F$_3$ crystal.

The resultant seed crystal was placed on the bottom of a quartz tube, and then the resultant compound SrB$_5$O$_7$F$_3$ was placed into a quartz tube.

The quartz tube was vacuumized to a vacuum degree of $1\times10^{-3}$ Pa, and was subjected to vacuum packaging with a flamer. The quartz tube was placed into a crucible descending furnace, and heated to 600° C. for 20 h. The position of the quartz tube was adjusted, so that the seeding temperature was 600° C., and then the quartz tube was slowly descended at a rate of 1 mm/h and was cooled slowly at a rate of 2° C./h. After the completion of growth, the growth furnace was cooled to 25° C. The quartz tube was removed to give an $SrB_5O_7F_3$ crystal with a dimension of $\Phi7$ mm×6 mm×5 mm.

Example 20

Growth of $SrB_5O_7F_3$ crystal by a solvothermal method:
The $SrB_5O_7F_3$ compound was synthesized according to the equation of $3Sr(BF_4)_2+7B_2O_3 \rightarrow 3SrB_5O_7F_3+5BF_3\uparrow$. The particular operation steps are similar to those in EXAMPLE 2.

The resultant compound $SrB_5O_7F_3$ was added into a hydrothermal reactor for sealing. The hydrothermal reactor was placed into a drying oven, heated at a rate of 20° C./h to 150° C. for 10 h, then cooled at a rate of 1° C./h to 25° C., and the hydrothermal reactor was opened to give a seed crystal of $SrB_5O_7F_3$ crystal.

The resultant seed crystal was placed on the bottom of the PTFE lining of a clean and non-contaminated hydrothermal reactor with a volume of 23 mL. Then, the resultant compound $SrB_5O_7F_3$ was added into the PTFE lining.

A solvent which was deionized water was added into the PTFE lining. The hydrothermal reactor was tightly sealed and placed into a drying oven, heated at a rate of 20° C./h to 150° C. for 24 h, then cooled at a rate of 2° C./day to 130° C., and then cooled at a rate of 2° C./h to 25° C., and the hydrothermal reactor was opened to give an $SrB_5O_7F_3$ crystal with a dimension of $\Phi5$ mm×6 mm×8 mm.

Example 21

Growth of $SrB_5O_7F_3$ crystal by a solvothermal method:
The $SrB_5O_7F_3$ compound was synthesized according to the equation of $3Sr(BF_4)_2+14H_3BO_3 \rightarrow 3SrB_5O_7F_3+5BF_3\uparrow+21H_2O\uparrow$. The particular operation steps are similar to those in EXAMPLE 2.

The resultant compound $SrB_5O_7F_3$ was placed on the bottom of the PTFE lining of a clean and non-contaminated hydrothermal reactor with a volume of 23 mL. The hydrothermal reactor was placed into a drying oven, heated at a rate of 20° C./h to 230° C. for 10 h, then cooled at a rate of 1° C./h to 25° C., and the hydrothermal reactor was opened to give a seed crystal of S $SrB_5O_7F_3$ crystal.

The resultant seed crystal was placed on the bottom of the PTFE lining of the hydrothermal reactor, and then the resultant compound $SrB_5O_7F_3$ was added into the PTFE lining of the hydrothermal reactor.

To the PTFE lining of the hydrothermal reactor was added 10 mL of solvent which was hydrofluoric acid. The hydrothermal reactor was tightly sealed and placed into a drying oven, heated at a rate of 20° C./h to 200° C. for 24 h, then cooled at a rate of 2° C./day to 100° C., and then cooled at a rate of 2° C./h to 25° C., and the hydrothermal reactor was opened to give an $SrB_5O_7F_3$ crystal with a dimension of $\Phi5$ mm×6 mm×4 mm.

Example 22

Growth of $SrB_5O_7F_3$ crystal by a solvothermal method:
The $SrB_5O_7F_3$ compound was synthesized according to the equation of $3Sr(BF_4)_2+14H_3BO_3 \rightarrow 3SrB_5O_7F_3+5BF_3\uparrow+21H_2O\uparrow$. The particular operation steps are similar to those in EXAMPLE 2.

The resultant compound $SrB_5O_7F_3$ was placed on the bottom of a clean and non-contaminated hydrothermal reactor equipped with a platinum sleeving and a stainless steel lining and having a volume of 50 mL. The hydrothermal reactor was placed in to a muffle furnace, heated at a rate of 30° C./h to 300° C. for 15 h, then cooled at a rate of 2° C./h to 25° C., and the hydrothermal reactor was opened to give a seed crystal of $SrB_5O_7F_3$ crystal.

The resultant seed crystal was placed on the bottom of a hydrothermal reactor equipped with a platinum sleeving and a stainless steel lining, and then the resultant compound $SrB_5O_7F_3$ was added into the hydrothermal reactor equipped with a platinum sleeving and a stainless steel lining.

To the hydrothermal reactor equipped with a platinum sleeving and a stainless steel lining platinum was added 50 mL of solvent which was deionized water. The hydrothermal reactor was tightly sealed and placed into a muffle furnace, heated at a rate of 30° C./h to 250° C. for 24 h, and then cooled at a rate of 2° C./day to 200° C., and then cooled at a rate of 5° C./h to 25° C., and the hydrothermal reactor was opened to give an $SrB_5O_7F_3$ crystal with a dimension of $\Phi5$ mm×4 mm×3 mm.

Example 23

Growth of $SrB_5O_7F_3$ crystal by a solvothermal method:
The $SrB_5O_7F_3$ compound was synthesized according to the equation of $3Sr(BF_4)_2+14H_3BO_3 \rightarrow 3SrB_5O_7F_3+5BF_3\uparrow+21H_2O\uparrow$. The particular operation steps are similar to those in EXAMPLE 2.

The resultant compound $SrB_5O_7F_3$ was placed on the bottom of a clean and non-contaminated hydrothermal reactor equipped with a platinum sleeving and a stainless steel lining and having a volume of 23 mL. The hydrothermal reactor was placed into a muffle furnace, heated at a rate of 35° C./h to 500° C. for 48 h, then cooled at a rate of 4° C./h to 25° C., and the hydrothermal reactor was opened to give a seed crystal of $SrB_5O_7F_3$ crystal.

The resultant seed crystal was placed on the bottom of a hydrothermal reactor equipped with a platinum sleeving and a stainless steel lining, and then the resultant compound $SrB_5O_7F_3$ was added into the hydrothermal reactor equipped with a platinum sleeving and a stainless steel lining.

To the hydrothermal reactor equipped with a platinum sleeving and a stainless steel lining was added 80 mL of solvent which was hydrofluoric acid. The hydrothermal reactor was tightly sealed, placed in a muffle furnace, heated at a rate of 40° C./h to 600° C. for 48 h, and then cooled at a rate of 3° C./day to 550° C., and then cooled at a rate of 10° C./h to 25° C., and the hydrothermal reactor was opened to give an $SrB_5O_7F_3$ crystal with a dimension of $\Phi5$ mm×6 mm×8 mm.

Example 24

Growth of $SrB_5O_7F_3$ crystal by a solvothermal method:
The $SrB_5O_7F_3$ compound was synthesized according to the equation of $3Sr(BF_4)_2+14H_3BO_3 \rightarrow 3SrB_5O_7F_3+5BF_3\uparrow+21H_2O\uparrow$. The particular operation steps are similar to those in EXAMPLE 2.

The resultant compound $SrB_5O_7F_3$ was placed on the bottom of the PTFE lining of a clean and non-contaminated hydrothermal reactor with a volume of 23 mL. The hydrothermal reactor was placed into a resistance furnace, heated at a rate of 40° C./h to 220° C. for 48 h, then cooled at a rate of 5° C./h to 25° C., and the hydrothermal reactor was opened to give a seed crystal of $SrB_5O_7F_3$ crystal.

The resultant seed crystal was placed on the bottom the PTFE lining of the hydrothermal reactor, and then the resultant compound $SrB_5O_7F_3$ was added into the PTFE lining of the hydrothermal reactor.

To the PTFE lining of the hydrothermal reactor was added 10 mL of solvent which was deionized water. The hydrothermal reactor was tightly sealed, placed into a drying oven, heated at a rate of 40° C./h to 210° C. for 35 h, and then cooled at a rate of 3° C./day to 160° C. and then cooled at a rate of 4° C./h to 25° C., and the hydrothermal reactor was opened to give an $SrB_5O_7F_3$ crystal with a dimension of Φ5 mm×6 mm×3 mm.

Example 25

Figure 2:
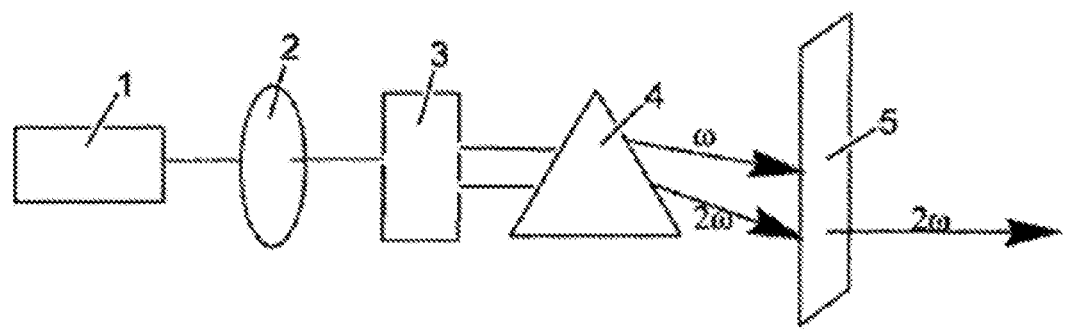
FIG. 2 is a working principle diagram of a nonlinear optical device made from the $SrB_5O_7F_3$ crystal of the present invention, wherein 1 represents a laser, 2 represents an incident light beam, 3 represents an $SrB_5O_7F_3$ crystal, 4 represents an emission light beam, and 5 represents a filter.

Any of $SrB_5O_7F_3$ crystals obtained in Examples 1-24 was processed in the phase-matching direction, and positioned at the site 3 as shown in FIG. 2. At room temperature, a Q-switched Nd:YAG laser was used as a light source with an incident wavelength of 1064 nm. The Q-switched Nd:YAG laser 1 emitted an infrared light beam 2 with a wavelength of 1064 nm into the $SrB_5O_7F_3$ single crystal 3, thereby producing a green harmonic light with a wavelength of 532 nm with an output intensity which was 1.5 times of KDP on equal conditions.

Example 26

Any of $SrB_5O_7F_3$ crystals obtained in Examples 1-24 was processed in the phase-matching direction, and positioned at the site 3 as shown in FIG. 2. At room temperature, a Q-switched Nd:YAG laser was used as a light source with an incident wavelength of 532 nm. The Q-switched Nd:YAG laser 1 emitted an infrared light beam 2 with a wavelength of 532 nm into the $SrB_5O_7F_3$ single crystal 3, thereby producing a harmonic light with a wavelength of 266 nm with an output intensity which was about 0.3 time of BBO on equal conditions.

Example 27

Any of $SrB_5O_7F_3$ crystals obtained in Examples 1-24 was processed in the phase-matching direction, and positioned at the site 3 as shown in FIG. 2. At room temperature, a Q-switched Nd:YAG laser was used as a light source with an incident wavelength of 355 nm. The Q-switched Nd:YAG laser 1 emitted an infrared light beam 2 with a wavelength of 355 nm into the $SrB_5O_7F_3$ single crystal 3, and the output of a deep UV harmonic light with a wavelength of 177.3 nm was observed.

Of course, the present invention can further have various embodiments. Without departing from the spirit and essence of the present invention, those of ordinary skill in the art can make various corresponding changes and modifications according to the disclosure of the present invention. However, these corresponding changes and modifications should all fall within the protection scope of the claims in the present invention.

The invention claimed is:

1. A compound strontium fluoroborate, wherein the compound has a chemical formula of $SrB_5O_7F_3$ with a molecular weight of 310.67, and is prepared via a solid-phase reaction method.

2. The compound strontium fluoroborate according to claim 1, wherein the compound is prepared in the following steps:
homogeneously mixing an Sr-containing compound which is $Sr(BF_4)_2$, B-containing compounds which are $H_3BO_3$ and $B_2O_3$, and an F-containing compound which is $Sr(BF_4)_2$ at a molar ratio of Sr:B:F=0.5-2:5-7:2-4, adding the mixture into a hydrothermal reactor or a quartz tube for sealing, placing the hydrothermal reactor or the quartz tube into a resistance furnace, heating at a rate of 10-30° C./h to 180-620° C. for 10-48 h, then cooling at a rate of 1-10° C./h to 25° C., and opening the hydrothermal reactor or the quartz tube to give the compound $SrB_5O_7F_3$.

3. A strontium fluoroborate nonlinear optical crystal, wherein the crystal has a chemical formula of $SrB_5O_7F_3$ with a molecular weight of 310.67, the crystal belongs to the orthorhombic crystal system with the space group of $Cmc2_1$, and has cell parameters as follows: a=10.016(6) Å, b=8.654(6)(4) Å, c=8.103(5) Å, Z=4, V=702.4(8) Å$^3$.

4. A method for preparing the strontium fluoroborate nonlinear optical crystal according to claim 3, wherein the crystals are grown by means of a flux method, a Bridgman-Stockbarger method, a room-temperature solution method or a solvothermal method;

the flux method for growing the strontium fluoroborate nonlinear optical crystal is particularly carried out in the following steps:
a, homogeneously mixing an Sr-containing compound which is $Sr(BF_4)_2$, B-containing compounds which are $H_3BO_3$ and $B_2O_3$, and an F-containing compound which is $Sr(BF_4)_2$ at a molar ratio of Sr:B:F=0.5-2:5-7:2-4, adding the mixture into a hydrothermal reactor or a quartz tube for sealing, placing the hydrothermal reactor or the quartz tube into a resistance furnace, heating at a rate of 10-30° C./h to a temperature of 180-620° C., keeping the temperature for 10-48 h, then cooling at a rate of 1-10° C./h to 25° C., and opening the hydrothermal reactor or the quartz tube to give the compound $SrB_5O_7F_3$;
b, adding the resultant compound $SrB_5O_7F_3$ into a quartz tube of Φ10 mm, vacuumizing the quartz tube to a vacuum degree of $1\times10^{-3}$ Pa, performing vacuum packaging with a flamer, placing the quartz tube into a muffle furnace, heating at a rate of 10-30° C./h to a temperature of 200-650° C., keeping the temperature for 12-60 h, then cooling at a rate of 1-5° C./h to 25° C., and opening the quartz tube to give a seed crystal of $SrB_5O_7F_3$ crystal;
c, placing the seed crystal of $SrB_5O_7F_3$ crystal obtained in step b on the bottom of a container which is a quartz tube, then mixing the compound $SrB_5O_7F_3$ obtained in step a with a flux which is NaF, $NaBF_4$, NaF—$H_3BO_3$, NaF—$B_2O_3$, $H_3BO_3$ or $B_2O_3$ at a molar ratio of 1:1-5, placing the mixture into the quartz tube, vacuumizing the quartz tube to a vacuum degree of $1\times10^{-3}$ Pa, and performing vacuum packaging with a flamer; and
d, sealing the container in step c or adding 10-100 mL of solvent which is deionized water, anhydrous ethanol, or hydrofluoric acid for re-sealing, placing the container into a resistance furnace, heating at a rate of 20-40° C./h to a temperature of 150-650° C., keeping the temperature for 12-60 h, cooling at a rate of 1-3° C./day to 50° C., further cooling at a rate of 1-10° C./h to 25° C., and opening the container to give an $SrB_5O_7F_3$ crystal with a dimension of 1-20 mm;

the Bridgman-Stockbarger method for growing the strontium fluoroborate nonlinear optical crystal is particularly carried out in the following steps:
a, homogeneously mixing an Sr-containing compound which is $Sr(BF_4)_2$, B-containing compounds which are $H_3BO_3$ and $B_2O_3$, an F-containing compound which is $Sr(BF_4)_2$ at a molar ratio of Sr:B:F=0.5-2:5-7:2-4, adding the mixture into a hydrothermal reactor or a quartz tube for sealing, placing the hydrothermal reactor or the quartz tube into a resistance furnace, heating at a rate of 10-30° C./h to a temperature of 180-620° C., keeping the temperature for 10-48 h, then cooling at a rate of 1-10° C./h to 25° C., and opening the hydrothermal reactor or the quartz tube to give the compound $SrB_5O_7F_3$;

b, adding the resultant compound $SrB_5O_7F_3$ into the hydrothermal reactor for sealing, placing the hydrothermal reactor into a drying oven, heating at a rate of 20° C./h to a temperature of 200° C., keeping the temperature for 10 h, then cooling at a rate of 1° C./h to 25° C., and opening the hydrothermal reactor to give a seed crystal of $SrB_5O_7F_3$ crystal;

c, placing the resultant seed crystal on the bottom of an iridium crucible, then adding the resultant compound $SrB_5O_7F_3$ into the iridium crucible; and d, sealing the iridium crucible and placing it into a crucible descending furnace, heating to a temperature of 350-600° C., keeping the temperature for 10-20 h, adjusting the position of the container to allow the temperature of spontaneous nucleation or seeding to be 350-600° C., and slowly descending the container at a rate of 0.05-2 mm/h while keeping the growth temperature constant or slowly cooling at a rate of 0-3° C./h, after the completion of growth, cooling the growth furnace to 25° C., removing the container to give an $SrB_5O_7F_3$ crystal with a dimension of 1-20 mm;

the room-temperature solution method for growing the strontium fluoroborate nonlinear optical crystal is particularly carried out in the following steps:

a, homogeneously mixing an Sr-containing compound which is $Sr(BF_4)_2$, B-containing compounds which are $H_3BO_3$ and $B_2O_3$, an F-containing compound which is $Sr(BF_4)_2$ at a molar ratio of Sr:B:F=0.5-2:5-7:2-4, adding the mixture into a hydrothermal reactor or a quartz tube for sealing, placing the hydrothermal reactor or the quartz tube into a resistance furnace, heating at a rate of 10-30° C./h to a temperature of 180-620° C., keeping the temperature for 10-48 h, then cooling at a rate of 1-10° C./h to 25° C., and opening the hydrothermal reactor or the quartz tube to give the compound $SrB_5O_7F_3$;

b, adding the compound $SrB_5O_7F_3$ obtained in step a into the hydrothermal reactor for sealing, placing the hydrothermal reactor into a drying oven, heating at a rate of 10-30° C./h to a temperature of 200-600° C., keeping the temperature for 10-48 h, then cooling at a rate of 1-5° C./h to 25° C., and opening the hydrothermal reactor or the quartz tube to give a seed crystal of $SrB_5O_7F_3$ crystal;

c, placing the seed crystal obtained in step b on the bottom of a cleaned container, then adding the resultant compound $SrB_5O_7F_3$ into the container; and d, adding 10-100 mL of solvent which is deionized water, anhydrous ethanol or hydrofluoric acid into the container in step c, which is then subjected to an ultrasonic treatment for sufficient mixing and dissolution, adjusting the pH of the solution to 1-11, filtering the mixture with a qualitative filter paper, encapsulating the container with a PVC film, placing the container in a static environment without shaking, contamination, or air convection, piercing and forming several holes in the seal to adjust the evaporation rate of the solvent in the solution, standing at room temperature, and after the completion of growth, giving an $SrB_5O_7F_3$ crystal with a dimension of 1-20 mm;

the solvothermal method for growing the strontium fluoroborate nonlinear optical crystal is particularly carried out in the following steps:

a, homogeneously mixing an Sr-containing compound which is $Sr(BF_4)_2$, B-containing compounds which are $H_3BO_3$ and $B_2O_3$, an F-containing compound which is $Sr(BF_4)_2$ at a molar ratio of Sr:B:F=0.5-2:5-7:2-4, adding the mixture into a hydrothermal reactor or a quartz tube for sealing, placing the hydrothermal reactor or the quartz tube into a resistance furnace, heating at a rate of 10-30° C./h to a temperature of 180-620° C., keeping the temperature for 10-48 h, then cooling at a rate of 1-10° C./h to 25° C., and opening the hydrothermal reactor or the quartz tube to give the compound $SrB_5O_7F_3$;

b, adding the compound $SrB_5O_7F_3$ obtained in step a into the hydrothermal reactor for sealing, placing the hydrothermal reactor into a drying oven, heating at a rate of 10-30° C./h to a temperature of 200-600° C., keeping the temperature for 10-48 h, then cooling at a rate of 1-5° C./h to 25° C., and opening the hydrothermal reactor or the quartz tube to give a seed crystal of $SrB_5O_7F_3$ crystal;

c, placing the seed crystal obtained in step b on the bottom of PTFE lining of a clean and non-contaminated hydrothermal reactor with a volume of 23 mL, then adding the resultant compound $SrB_5O_7F_3$ into the PTFE lining; and d, adding into the PTFE lining a solvent which is deionized water, and sealing the hydrothermal reactor; placing the hydrothermal reactor into a drying oven, heating at a rate of 20° C./h to a temperature of 150° C., keeping the temperature for 24 h, cooling at a rate of 2° C./day to 130° C., and then cooling at a rate of 2° C./h to 25° C., and opening the hydrothermal reactor to give the $SrB_5O_7F_3$ crystal.

5. The method for preparing the strontium fluoroborate nonlinear optical crystal according to claim 4, wherein in step c of the flux method, the NaF—$H_3BO_3$ flux system comprises NaF and $H_3BO_3$ at a molar ratio of 1-3:1-5; and the NaF—$B_2O_3$ system comprises NaF and $B_2O_3$ at a molar ratio of 1-2:1-4.

6. A method for producing 2nd, or 3rd, or 4th, or 5th, or 6th harmonic light output based on a fundamental frequency light output of 1064 nm from a Nd:YAG laser, comprising applying a light source with an incident wavelength of 1064 nm from a Nd:YAG laser to the strontium fluoroborate nonlinear optical crystal according to claim 3.

7. A method for producing deep ultraviolet harmonic light output below 200 nm, comprising applying a light source to the strontium fluoroborate nonlinear optical crystal according to claim 3.

8. A method for preparing a harmonic generator, an up-and-down frequency converter, or an optical parametric-oscillator, comprising forming the harmonic generator, the up-and-down frequency converter, or the parametric-oscillator from the strontium fluoroborate nonlinear optical crystal according to claim 3.

\* \* \* \* \*